(12) United States Patent
Zang et al.

(10) Patent No.: US 9,337,197 B1
(45) Date of Patent: May 10, 2016

(54) SEMICONDUCTOR STRUCTURE HAVING FINFET ULTRA THIN BODY AND METHODS OF FABRICATION THEREOF

(71) Applicant: GLOBALFOUNDRIES Inc., Grand Cayman (KY)

(72) Inventors: Hui Zang, Guilderland, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/525,763

(22) Filed: Oct. 28, 2014

(51) Int. Cl.
| | | |
|---|---|---|
| *H01L 21/20* | (2006.01) | |
| *H01L 21/36* | (2006.01) | |
| *H01L 21/40* | (2006.01) | |
| *H01L 27/092* | (2006.01) | |
| *H01L 29/161* | (2006.01) | |
| *H01L 29/16* | (2006.01) | |
| *H01L 21/8238* | (2006.01) | |
| *H01L 21/02* | (2006.01) | |
| *H01L 29/66* | (2006.01) | |

(52) U.S. Cl.
CPC ........ *H01L 27/0924* (2013.01); *H01L 21/0217* (2013.01); *H01L 21/02532* (2013.01); *H01L 21/823821* (2013.01); *H01L 27/0922* (2013.01); *H01L 29/16* (2013.01); *H01L 29/161* (2013.01); *H01L 29/6656* (2013.01)

(58) Field of Classification Search
CPC ......... H01L 21/20; H01L 21/36; H01L 21/04; H01L 21/823807; H01L 21/823842; H01L 27/092; H01L 29/7843
USPC .......................................... 438/478; 257/369
See application file for complete search history.

(56) References Cited

U.S. PATENT DOCUMENTS

| | | | | |
|---|---|---|---|---|
| 7,989,306 | B2* | 8/2011 | Liu .................... | H01L 21/76243 257/594 |
| 2005/0200711 | A1* | 9/2005 | Shimizu ............ | H01L 27/14614 348/207.99 |
| 2009/0191712 | A1* | 7/2009 | Higashi ............... | H01L 21/0273 438/703 |
| 2010/0200880 | A1* | 8/2010 | Sit ........................ | H01L 33/02 257/98 |
| 2011/0104901 | A1* | 5/2011 | Yatsuda ............. | H01L 21/0337 438/703 |
| 2015/0171177 | A1* | 6/2015 | Cheng ............... | H01L 29/42372 257/288 |

* cited by examiner

*Primary Examiner* — Phuc Dang
(74) *Attorney, Agent, or Firm* — Heslin Rothenberg Farley and Mesiti PC; Nicholas Mesiti

(57) ABSTRACT

In one aspect there is set forth herein a semiconductor structure having fins extending upwardly from an ultrathin body (UTB). In one embodiment a multilayer structure can be disposed on a wafer and can be used to pattern voids extending from a UTB layer of the wafer. Selected material can be formed in the voids to define fins extending upward from the UTB layer. In one embodiment silicon (Si) can be grown within the voids to define the fins. In one embodiment, germanium based material can be grown within the voids to define the fins.

20 Claims, 17 Drawing Sheets

SEMICONDUCTOR STRUCTURE HAVING FINFET ULTRA THIN BODY AND METHODS OF FABRICATION THEREOF

TECHNICAL FIELD

The present invention relates to semiconductor devices, and more particular a semiconductor device having a hybrid structure.

BACKGROUND

Different semiconductor devices may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A system using multiple discrete devices optimized for different functions presents challenges in terms of system complexity, system footprint and cost.

A semiconductor device can be provided by a discrete device, e.g., a field effect transistor (FET), a diode, and resistor. A semiconductor device can be provided by a structure, e.g., a wafer, a die, an integrated circuit having one or a plurality of discrete semiconductor devices.

Optimization challenges are pronounced with continued miniaturization of semiconductor devices. A FET short channel effect can occur when a channel length is reduced to length on an order of magnitude of a source and drain depletion region dimension. With short channel effects present, FET performance can be rendered more difficult to control.

Various FET architectures have been proposed for addressing the short channel effect. In ultra thin body (UTB) architecture, a FET is formed on an ultrathin layer (e.g., 2 nm-20 nm). In a FinFET architecture, a bulk silicon substrate can be recessed to define fins on which a wrap around gate can be formed to reduce a short channel effect.

BRIEF DESCRIPTION

In one aspect there is set forth herein a semiconductor structure having fins extending upwardly from an ultrathin body (UTB). In one embodiment a multilayer structure can be disposed on a wafer and can be used to pattern voids extending from a UTB layer of the wafer. Selected material can be formed in the voids to define fins extending upward from the UTB layer. In one embodiment silicon (Si) can be grown within the voids to define the fins. In one embodiment, a germanium based material can be grown within the voids to define the fins.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

In one aspect there is set forth herein a semiconductor structure having fins extending upwardly from an ultrathin body (UTB). In one embodiment a multilayer structure can be disposed on a wafer and can be used to pattern voids extending from a UTB layer of the wafer. Selected material can be formed in the voids to define fins extending upward from the UTB layer. In one embodiment silicon (Si) can be grown within in the voids to define the fins. In one embodiment, germanium based material can be grown within the voids to define the fins.

Figure 1:
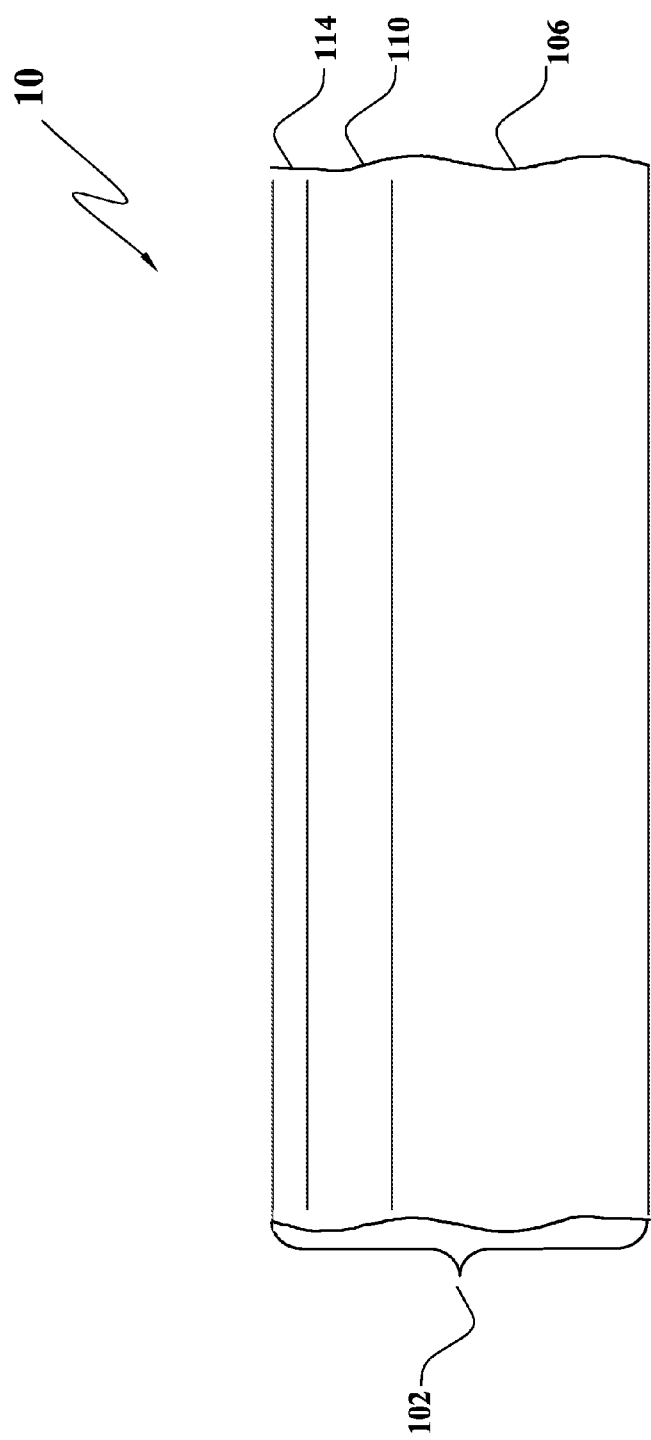
FIG. 1 illustrates a semiconductor structure in an intermediary stage fabrication.

Fabrication of an exemplary semiconductor structure 10 is described with reference to FIGS. 1-17. Referring to FIG. 1 there can be provided a wafer 102 having one or more thin layer. Wafer 102 can include a layer 106 of bulk silicon, a layer 110 provided by an insulator and a layer 114. Layer 114 in one embodiment can include a thickness of from about 2 nm to about 20 nm. In one embodiment, layer 114 can be a silicon (Si) layer and wafer 102 can be a silicon on Insulator (SOI) wafer. In one embodiment, layer 114 can be provided by a germanium based material, e.g., SiGe or Ge. In one embodiment, wafer 102 can be a germanium on Insulator (GOI) wafer. In one embodiment, layer 114 where provided by a germanium based material can be formed using a germanium condensation process. In one embodiment, wafer 102 can be prefabricated.

Figure 2:
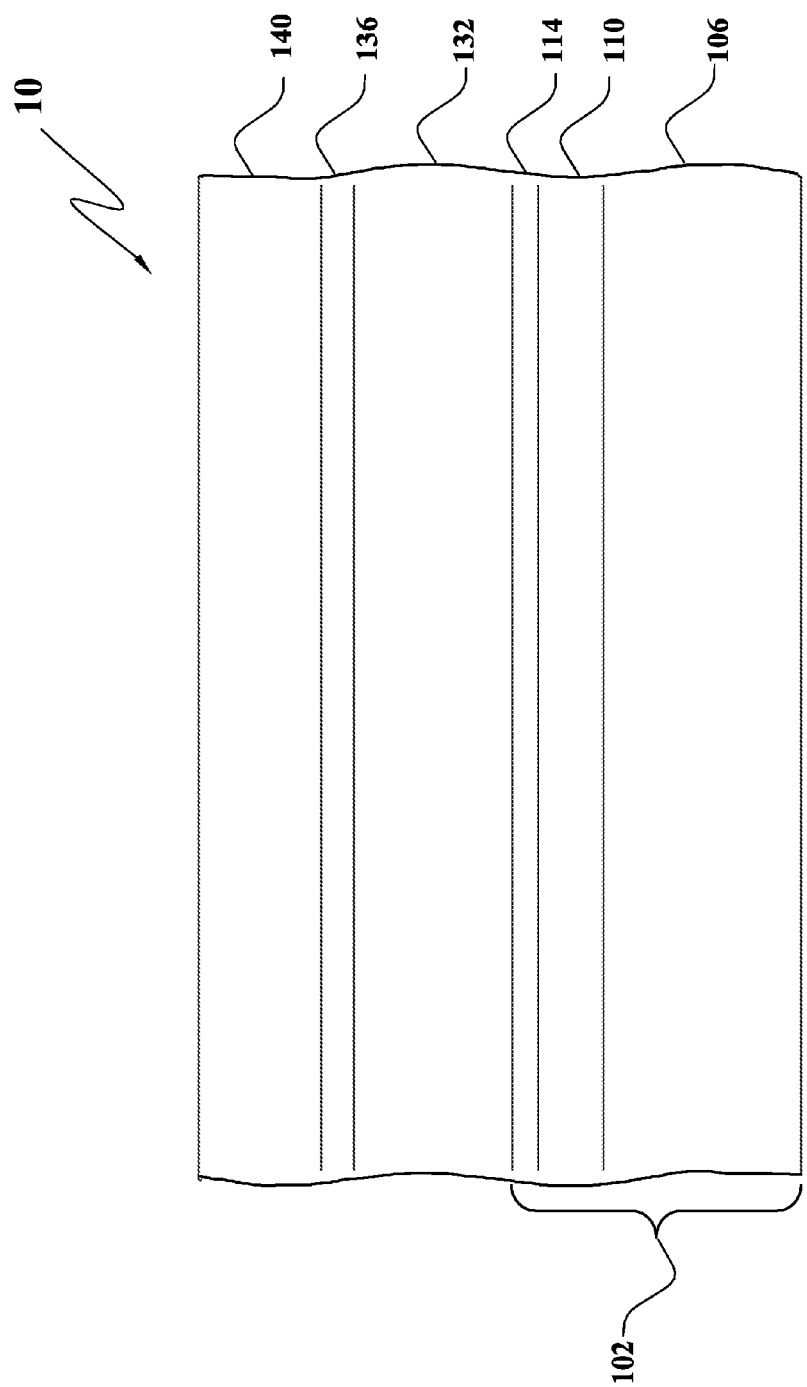
FIG. 2 illustrates a semiconductor structure in an intermediary stage fabrication, after disposing of a multilayer structure on a wafer.

Referring to FIG. 2, FIG. 2 illustrates the semiconductor structure 10 of FIG. 1 after forming of multilayer structure on wafer 102. In the embodiment of FIG. 2 a multilayer structure can include a layer 132 of amorphous silicon or polysilicon followed by a layer 136 of SiN followed by a layer 140 of amorphous silicon or polysilicon. Layers 132 and 140 in one embodiment can have a thickness of from about 20 nm to about 70 nm. Layer 136 of SiN can have a thickness of from about 5 nm to about 20 nm in one embodiment.

Figure 3:
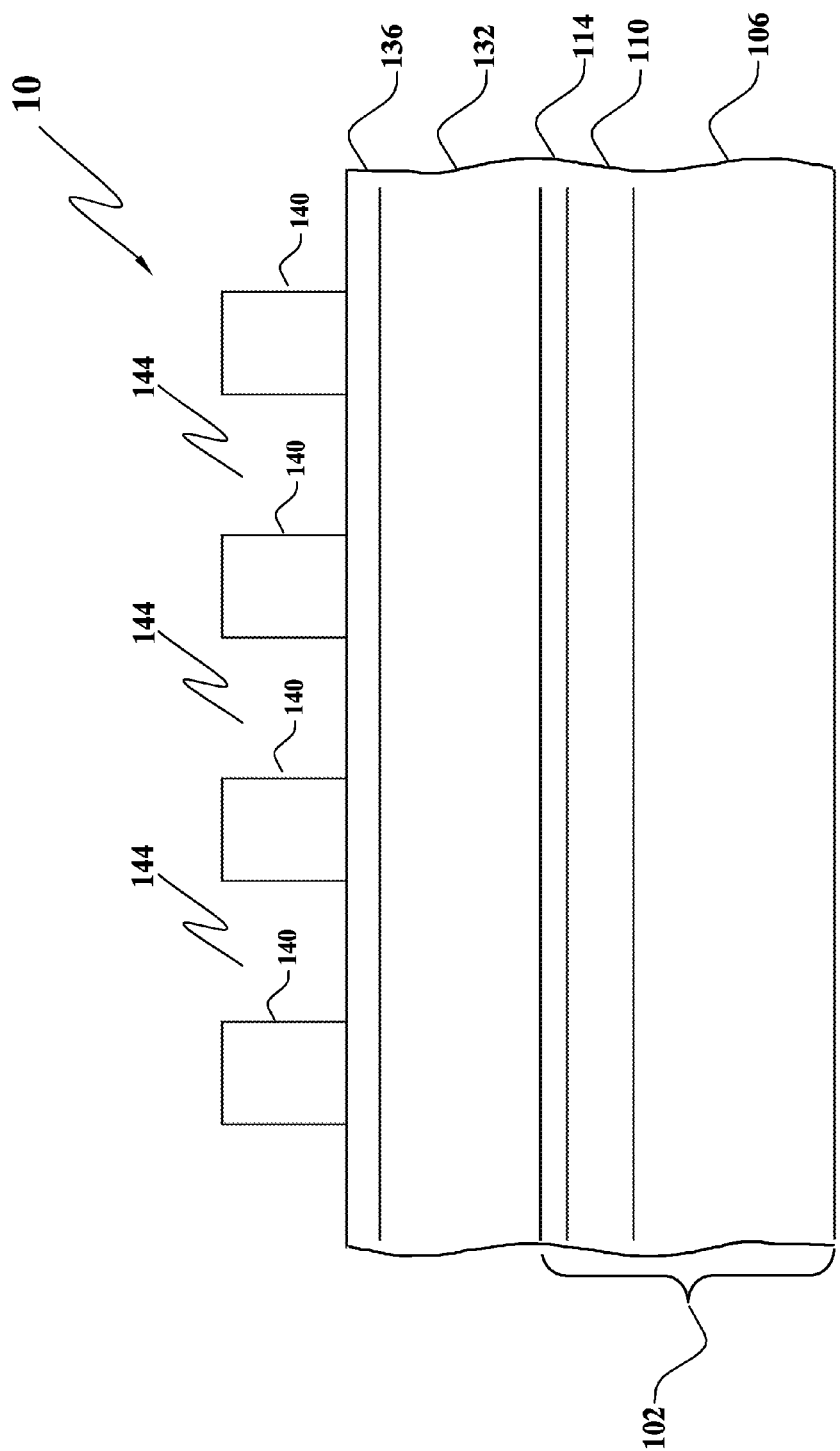
FIG. 3 illustrates a semiconductor structure in an intermediary stage fabrication, after patterning of a layer to define holes.

Referring to FIG. 3, FIG. 3 illustrates the semiconductor structure 10 of FIG. 2 after patterning and etching of layer 140. Referring to FIG. 3 layer 140 can be subject to removal to define hole 144. In the removal of layer 140, layer 136 can serve as an etch stop.

Figure 4:
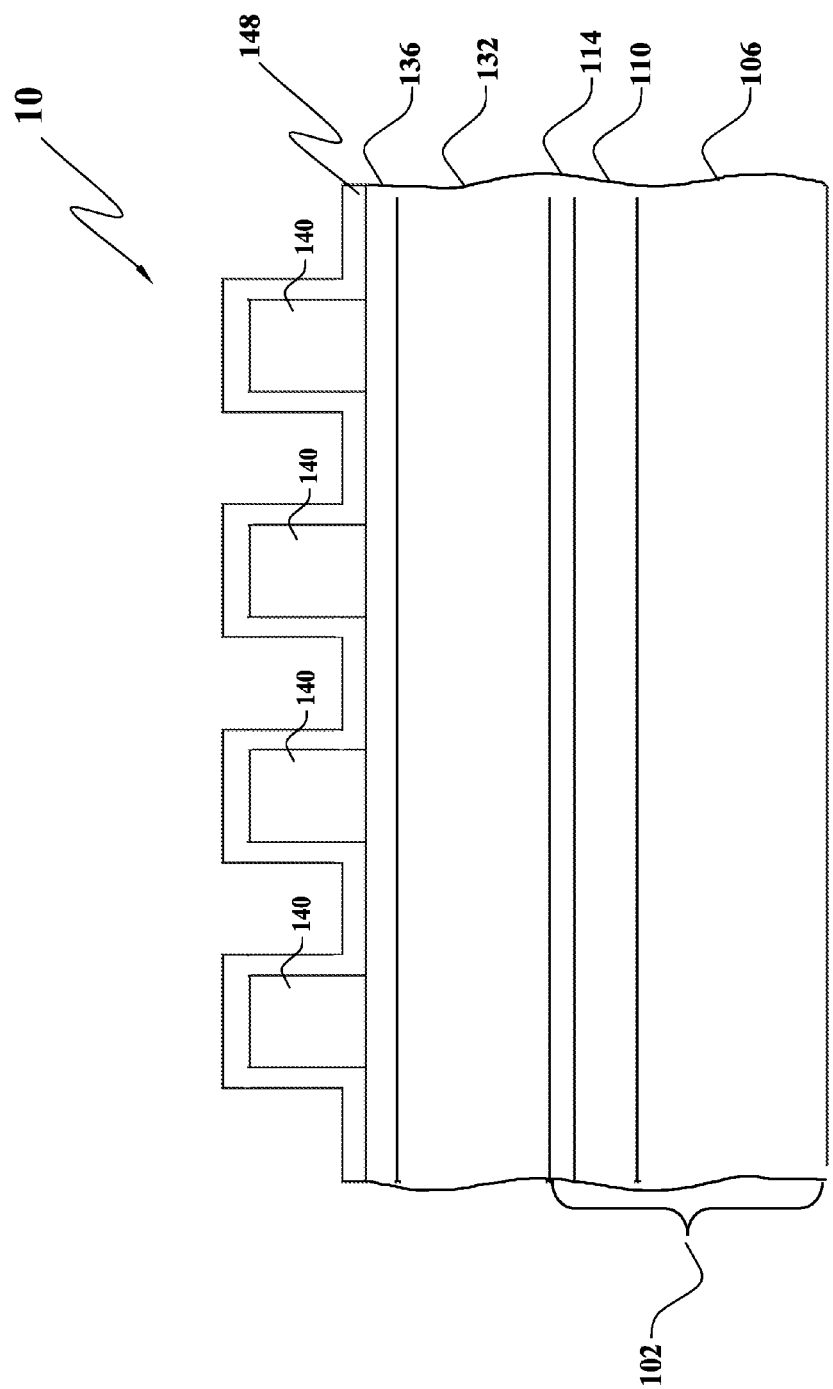
FIG. 4 illustrates a semiconductor structure in an intermediary stage fabrication.

Referring to FIG. 4, FIG. 4 illustrates the semiconductor structure of FIG. 3 after deposition of layer 148. Layer 148 in one embodiment can be an oxide layer. Layer 148 can have a thickness of from about 5 nm to about 30 nm in one embodiment.

Figure 5:
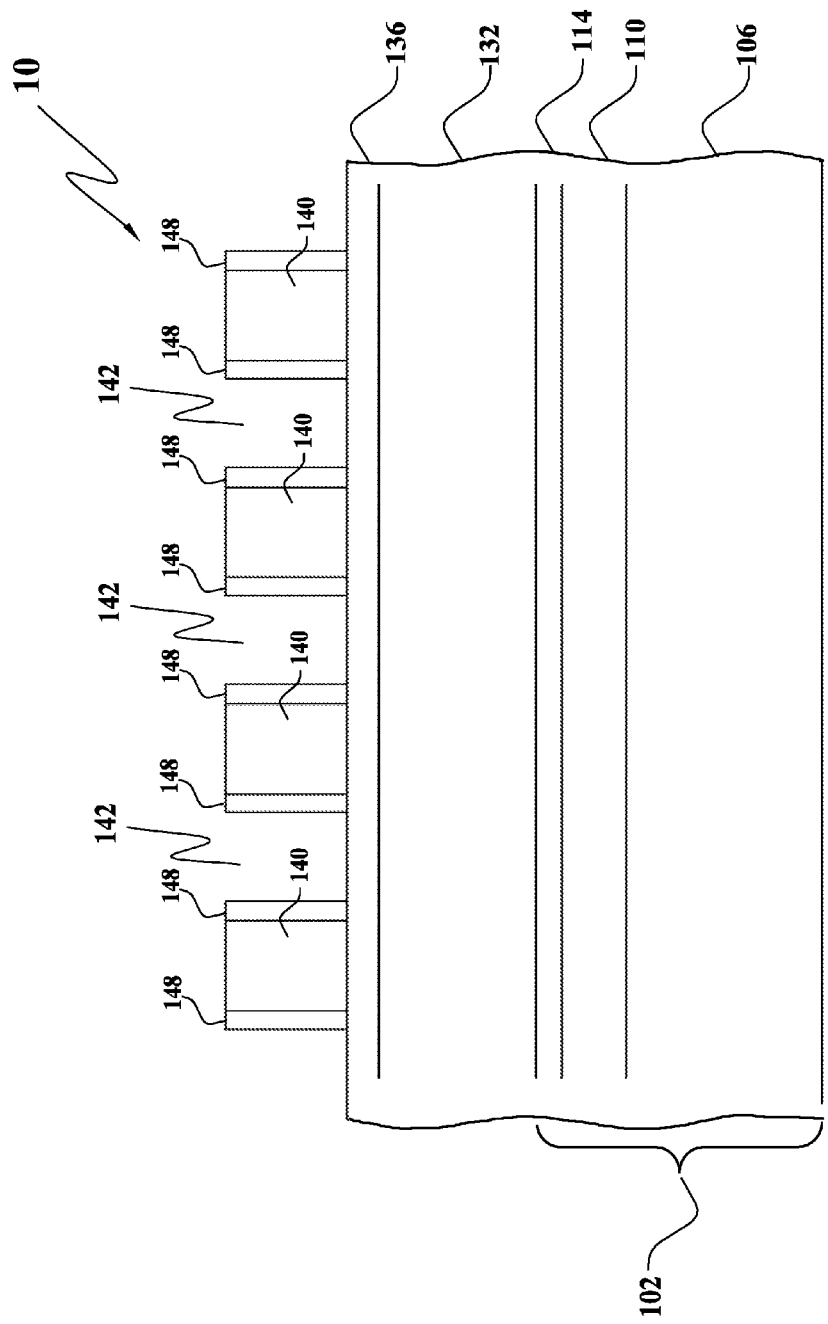
FIG. 5 illustrates a semiconductor structure in an intermediary stage fabrication, after removal of a portion of a layer in define sidewalls.

Referring to FIG. 5, FIG. 5 illustrates the semiconductor structure 10 of FIG. 4 after being subject to removal of portions of layer 148 so that layer 148 defines sidewalls as shown in FIG. 5.

Figure 6:
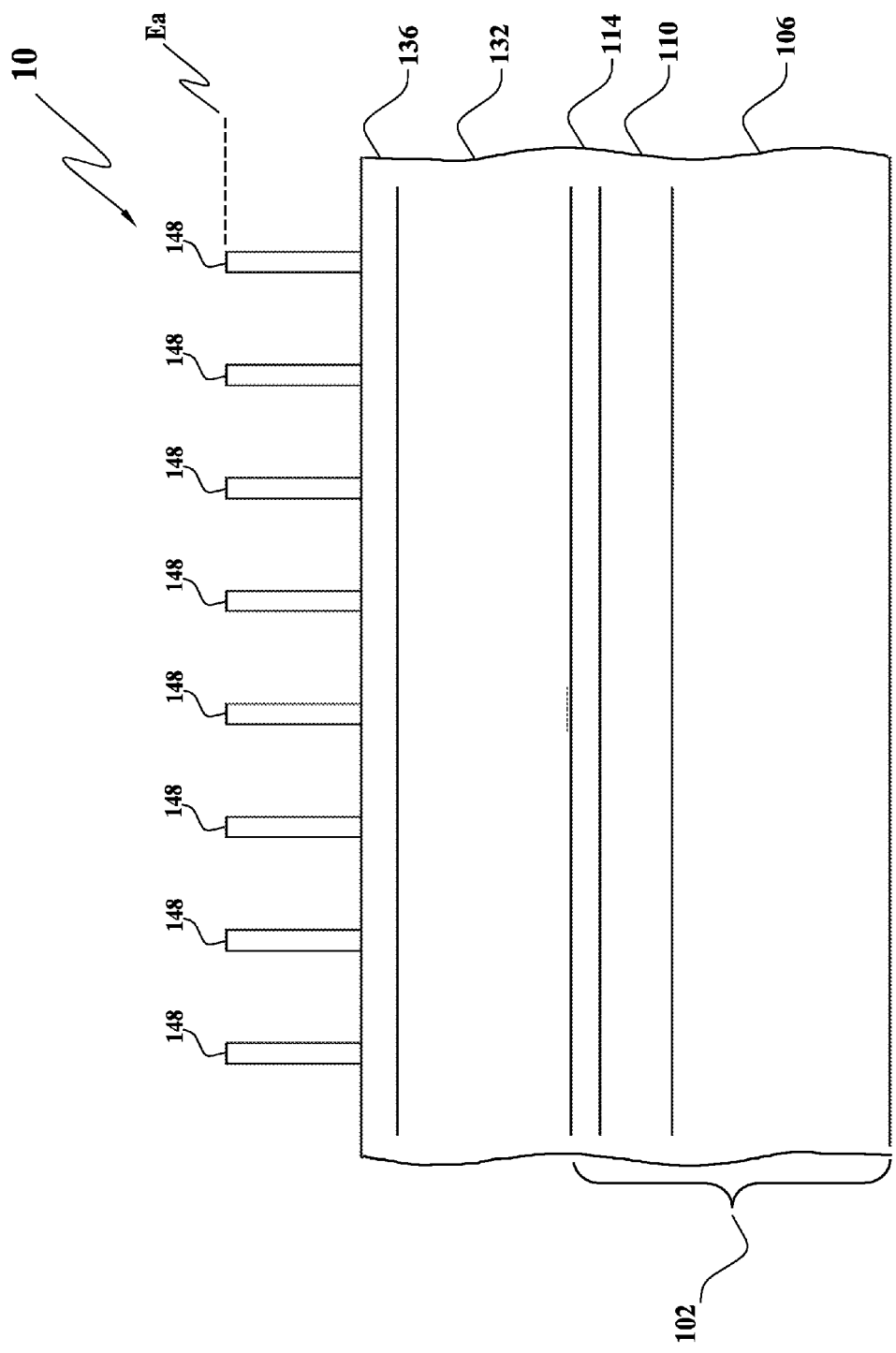
FIG. 6 illustrates a semiconductor structure in an intermediary stage fabrication.

Referring to FIG. 6, FIG. 6 illustrates the semiconductor structure 10 of FIG. 5 after removal of a remaining portion of layer 140. After removal of a remaining portion of layer 140, sidewalls defined by layer 148 extend upward from layer 114 without there being material between sections of the sidewalls defined by layer 148.

Figure 7:
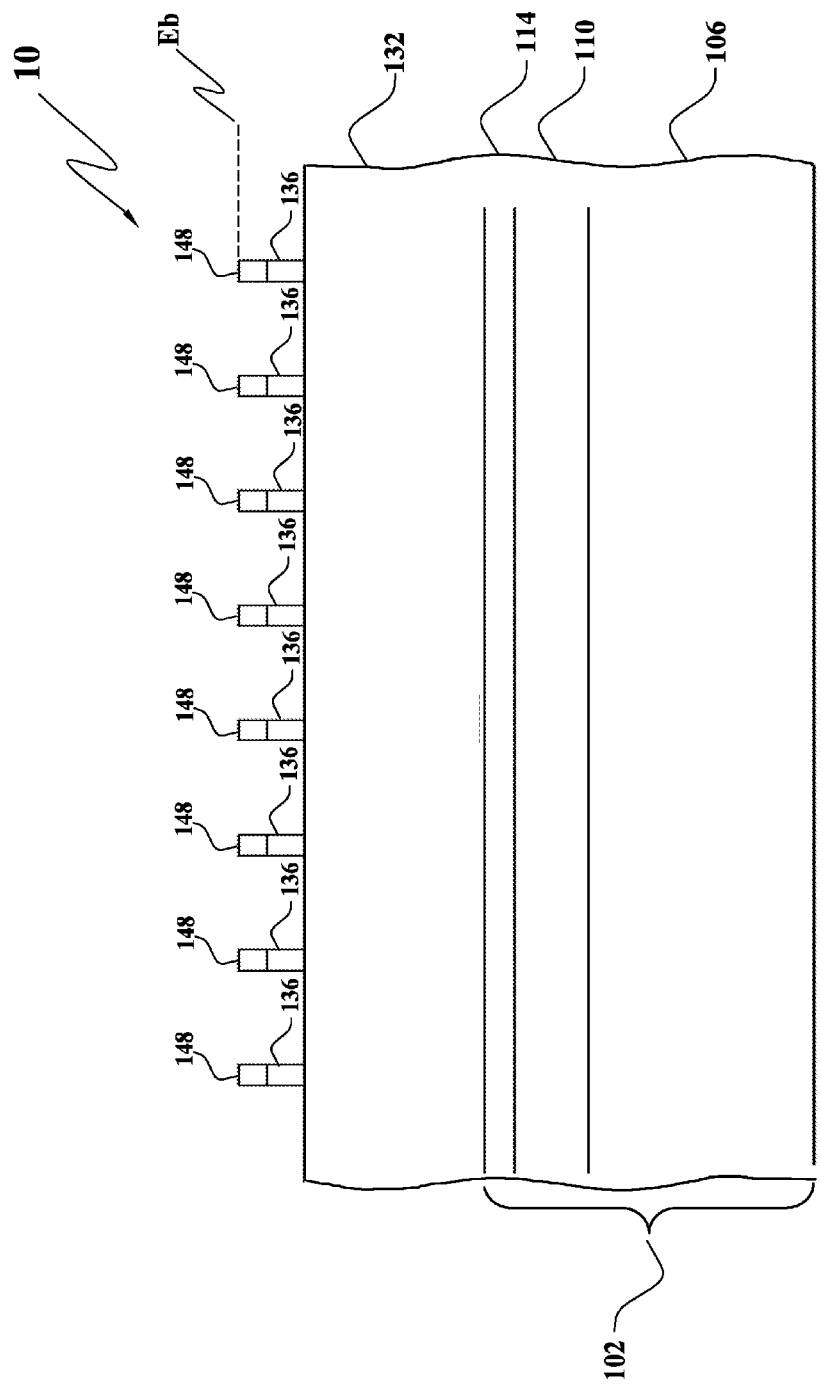
FIG. 7 illustrates a semiconductor structure in an intermediary stage fabrication.

Referring to FIG. 7, FIG. 7 illustrates the semiconductor structure 10 of FIG. 6 after removal of a portion of layer 136. For removal of a portion of layer 136 as shown in FIG. 7 layer 148 defining sidewalls can serve as a mask and portions of layer 136 that are not aligned to the sidewalls defined by layer 148 can be subject to removal. During the removal illustrated in FIG. 7 a portion of layer 148 can be removed. An elevation of sidewalls defined by layer 148 can be lowered during the removal illustrated in FIG. 7. Referring to FIG. 6, a top of sidewalls defined by layer 148 can have a top elevation of $E=E_a$. After a removal deposited in FIG. 7, sidewalls defined by layer 148 can have a top elevation of $E=E_b$, $E_b<E_a$.

Figure 8:
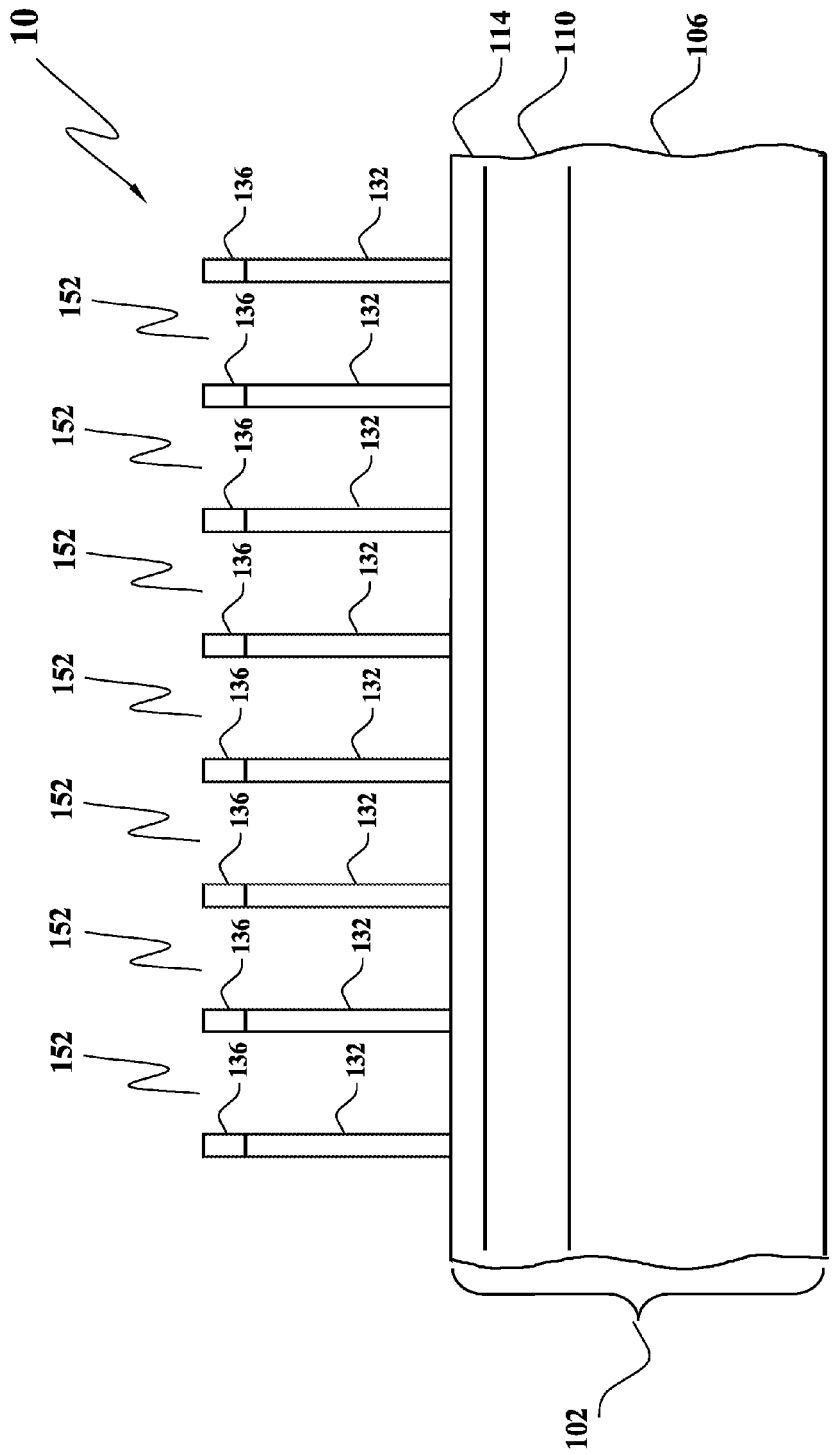
FIG. 8 illustrates a semiconductor structure in an intermediary stage fabrication, after removal of a portion of a layer to define holes.

Referring to FIG. 8, FIG. 8 illustrates the semiconductor structure 10 of FIG. 7 after removal of a portion of layer 132. For removal of a portion of layer 136 as shown in FIG. 8, layer 132 and layer 148 can serve as a mask and portions of layer 132 that are not aligned to remaining portions of layer 136 and layer 148 can be removed. Holes 152 can be defined between sections of material that define a remaining portion of layer 132 and layer 136.

Figure 9:
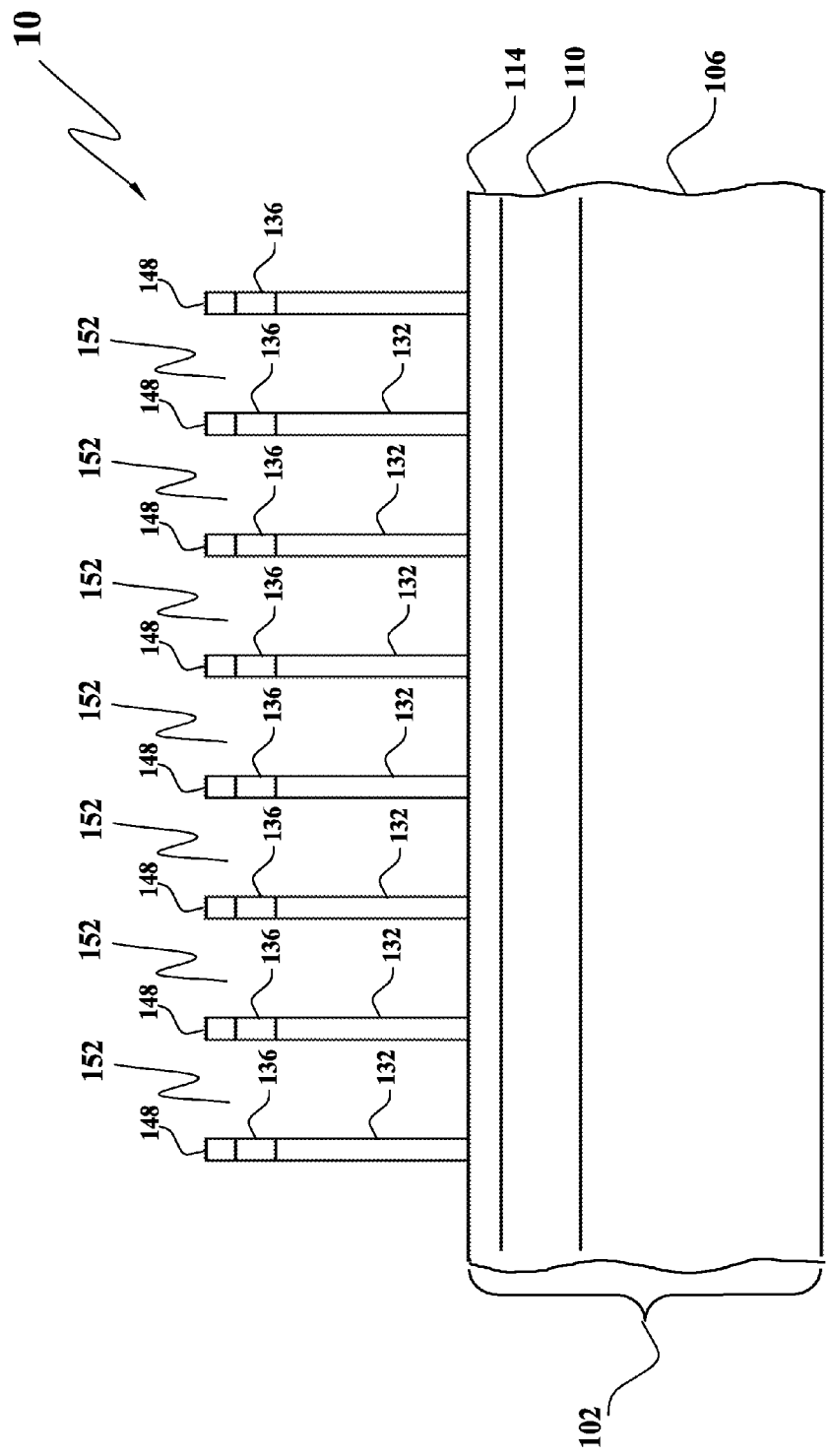
FIG. 9 illustrates a semiconductor structure in an intermediary stage fabrication.

Referring to FIG. 9, FIG. 9 illustrates the semiconductor structure 10 of FIG. 7 after removal of a portion of layer 132. FIG. 9 illustrates an alternative to the stage depicted in FIG. 8. In the alternative depicted in FIG. 9 a remaining portion of layer 148 is removed. In the stage depicted in FIG. 9 a remaining portion of layer 148 is maintained and is not removed during a removal of a portion of layer 132. Holes 152 can be defined between sections of material that define a remaining portion of layer 132 and layer 136.

Figure 10:
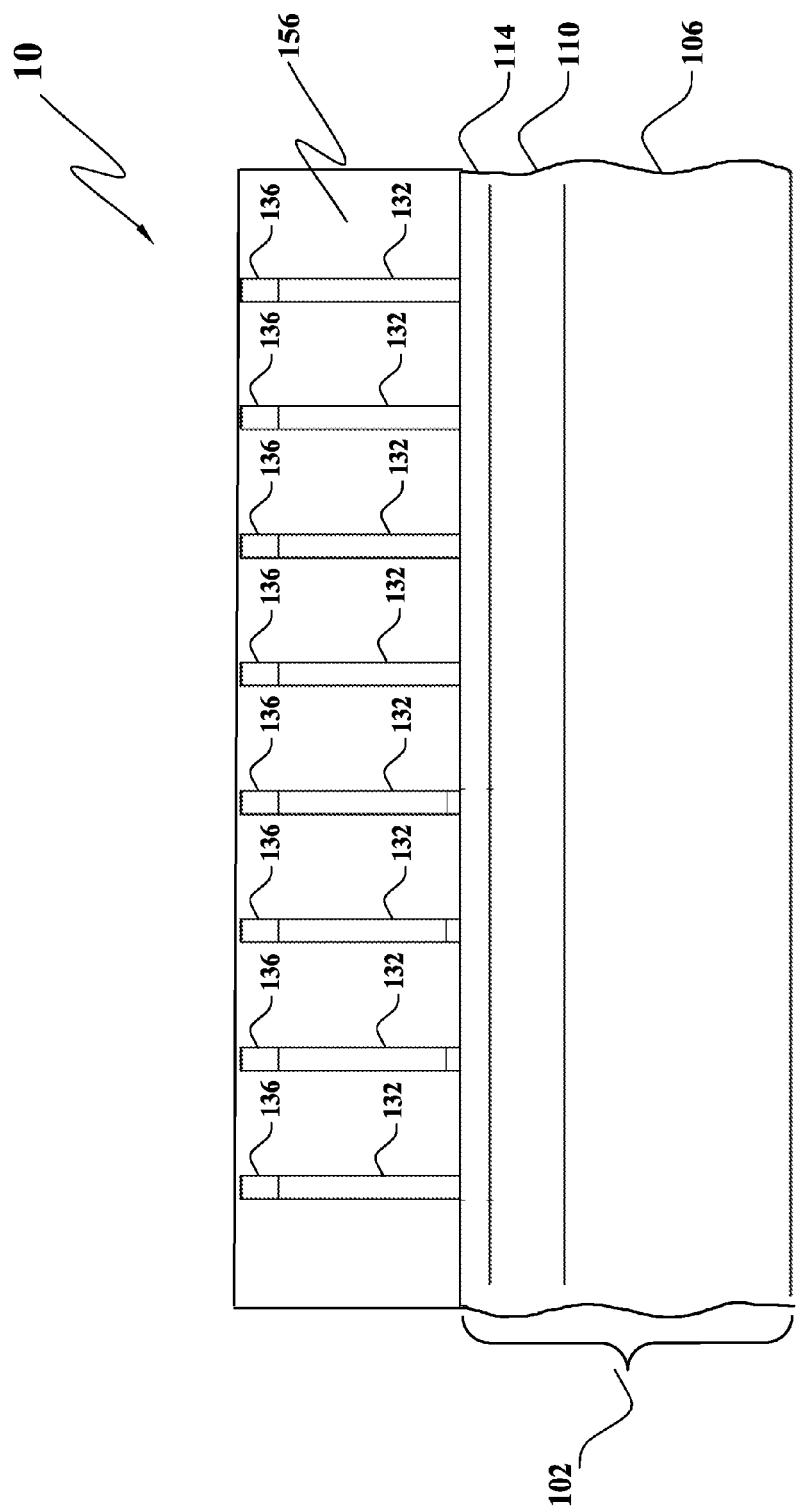
FIG. 10 illustrates a semiconductor structure in an intermediary stage fabrication, after filling of holes within a material.

Referring to FIG. 10, FIG. 10 illustrates the semiconductor structure 10 of FIG. 8 after deposition of layer 150 within holes 152 defined between remaining portions of layer 132 and layer 136. After deposition of layer 150 structure 10 can be subject to chemical mechanical planarization (CMP) to planarize the structure at a certain elevation. In the stage depicted in of FIG. 10 semiconductor structure 10 can be planarized to a top elevation of layer 136.

Figure 11:
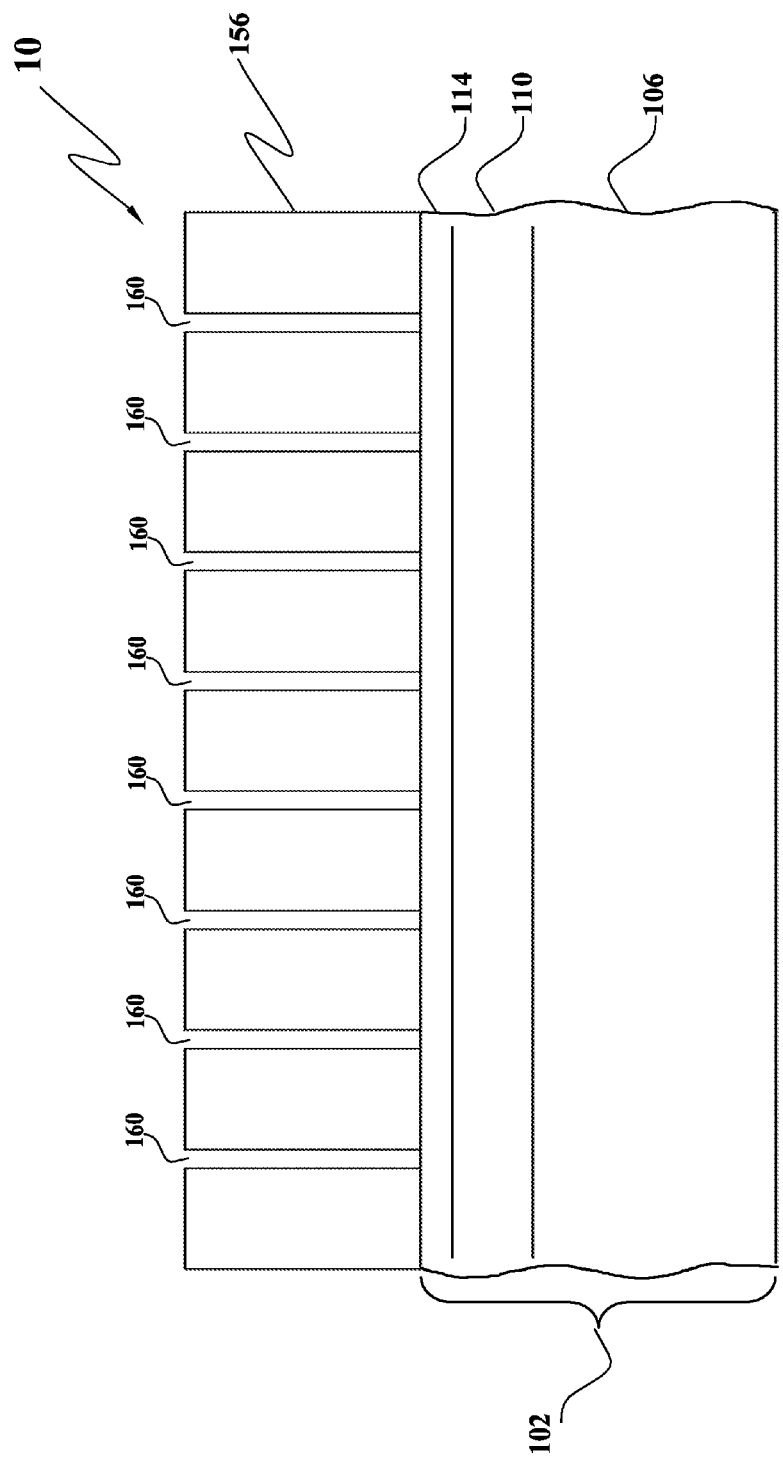
FIG. 11 illustrates a semiconductor structure in an intermediary stage fabrication, after removal of material to define voids.

Referring to FIG. 11, FIG. 11 illustrates the semiconductor structure 10 of FIG. 10 after removal of layer 132 and layer 136. Removal of layer 132 and layer 136 between sections of layer 150 can define voids 160 extending upward from layer 114.

Figure 12:
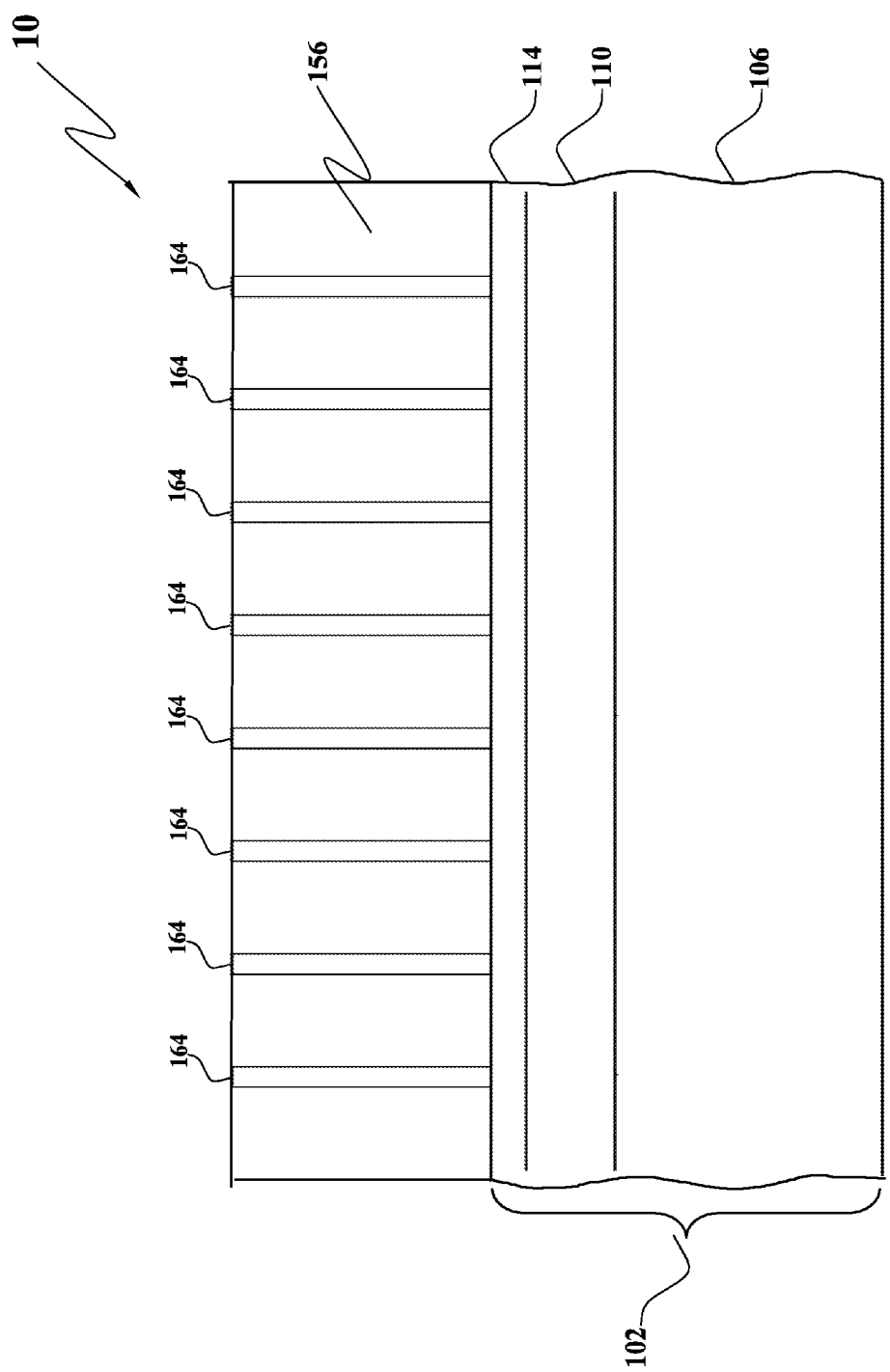
FIG. 12 illustrates a semiconductor structure in an intermediary stage fabrication.

Referring to FIG. 12, FIG. 12 illustrates the semiconductor structure 10 of FIG. 11 after formation of fins 164 within voids 160. Referring to FIG. 12, fins 164 within voids 160 can be formed by subjecting layer 114 to epitaxial growth to grow silicon upwardly from layer 114. In one embodiment an area of layer 114 on which fins 164 formed from Si can be grown, can be an nFET area of layer 114. An nFET area of layer 114 can have regions doped to define n type S/D regions.

Figure 13:
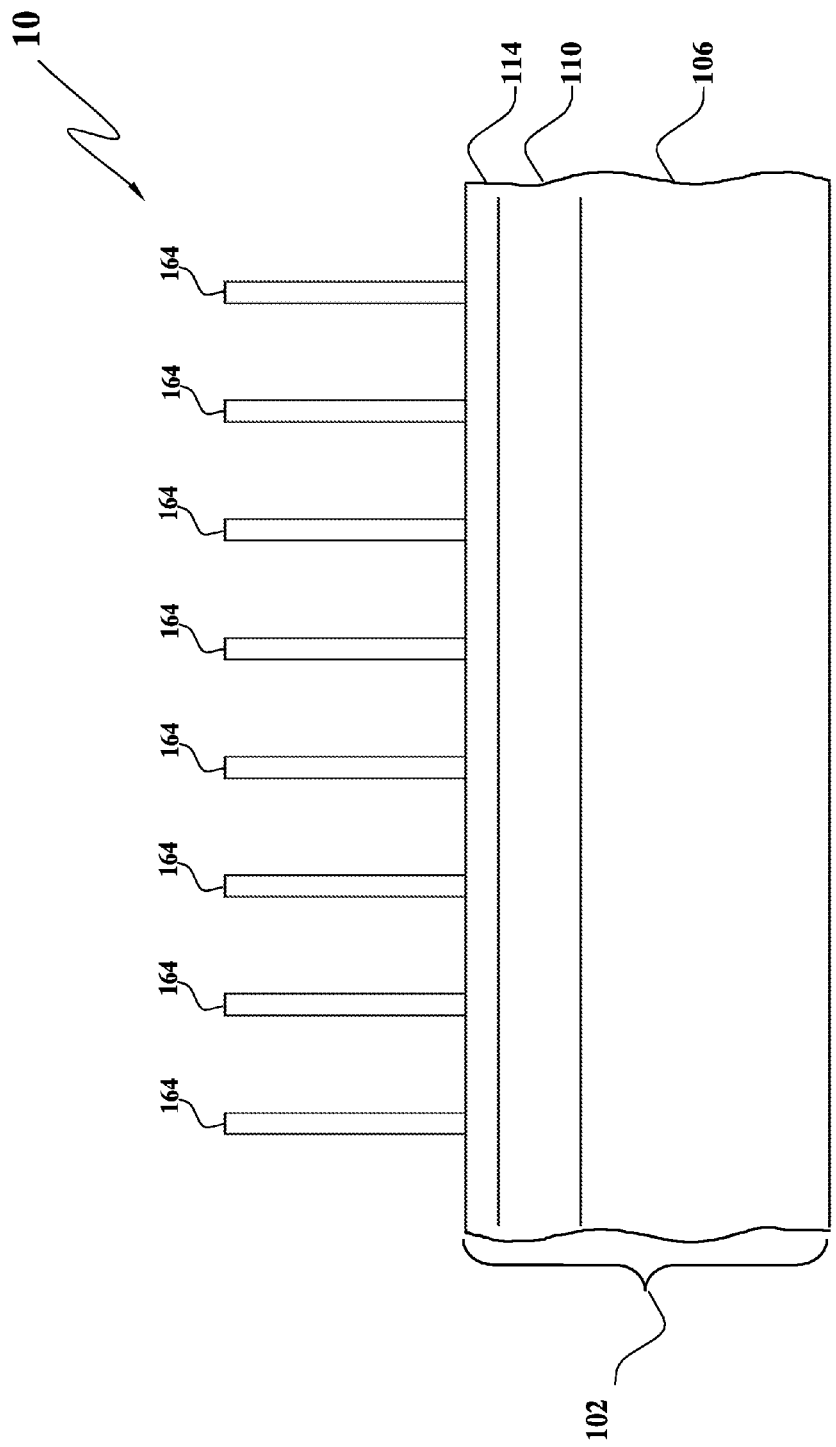
FIG. 13 illustrates a semiconductor structure in an intermediary stage fabrication.

Referring to FIG. 13, FIG. 13 illustrates the semiconductor structure 10 of FIG. 12 after removal of layer 156. Removal of layer 156 defines a FinFET structure having a fins 164 extending upwardly from layer 114 with the structure 10 being absent of material between fins 164.

Figure 14:
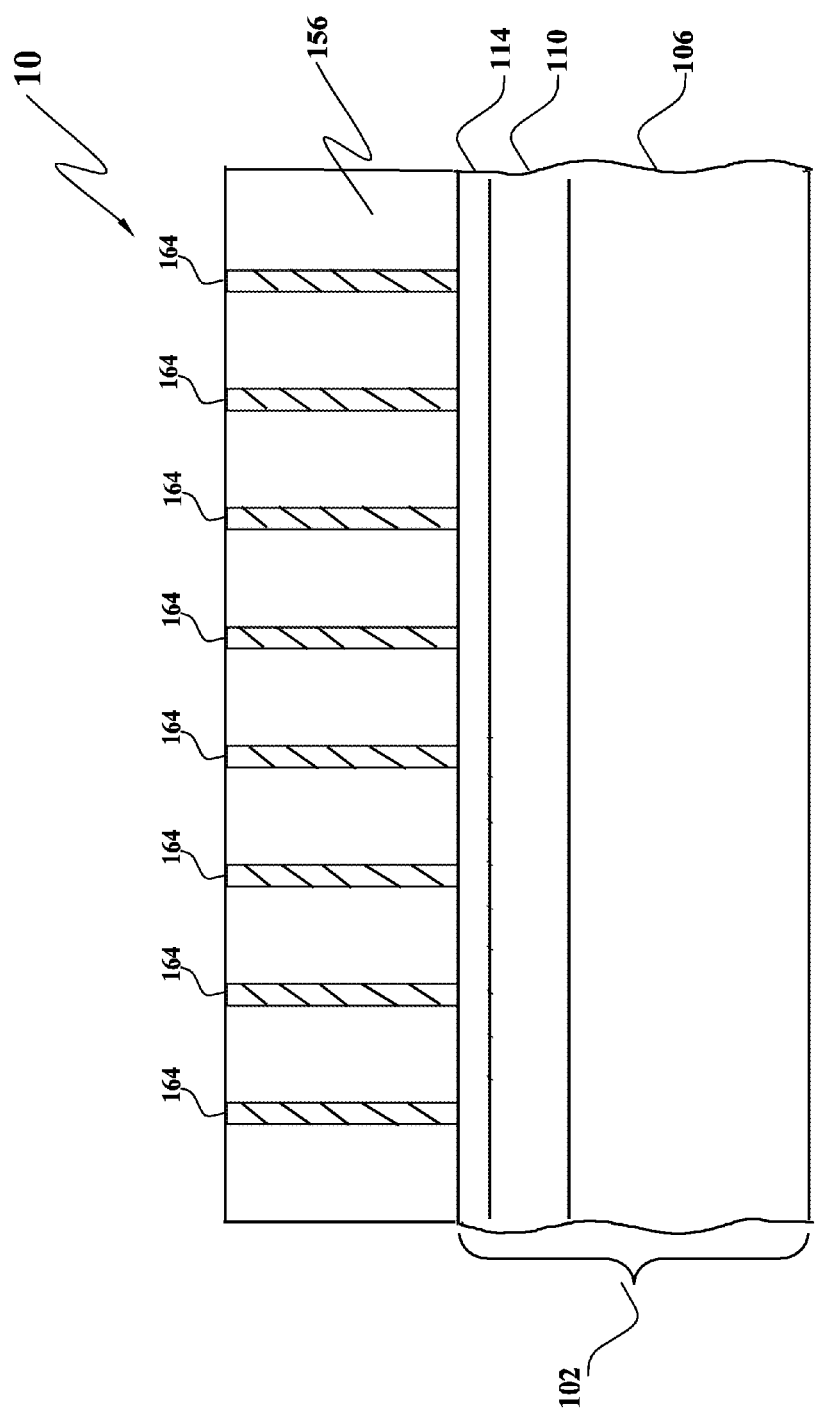
FIG. 14 illustrates a semiconductor structure in an intermediary stage fabrication.

Referring to FIG. 14, FIG. 14 illustrates the semiconductor structure 10 of FIG. 11 after formation of fins 164 within voids 160 using a process alternative to the process as depicted in FIG. 12. Referring to FIG. 14 fins 164 within voids 160 can be formed by subjecting layer 114 to epitaxial growth to grow germanium based material upwardly from layer 114. The germanium based material can be, e.g., SiGe or Ge. In one embodiment, an area of layer 114 on which a germanium based fin can be grown can be a p-type area of layer 114. A pFET area of layer 114 can have regions doped to define p type S/D regions.

Figure 15:
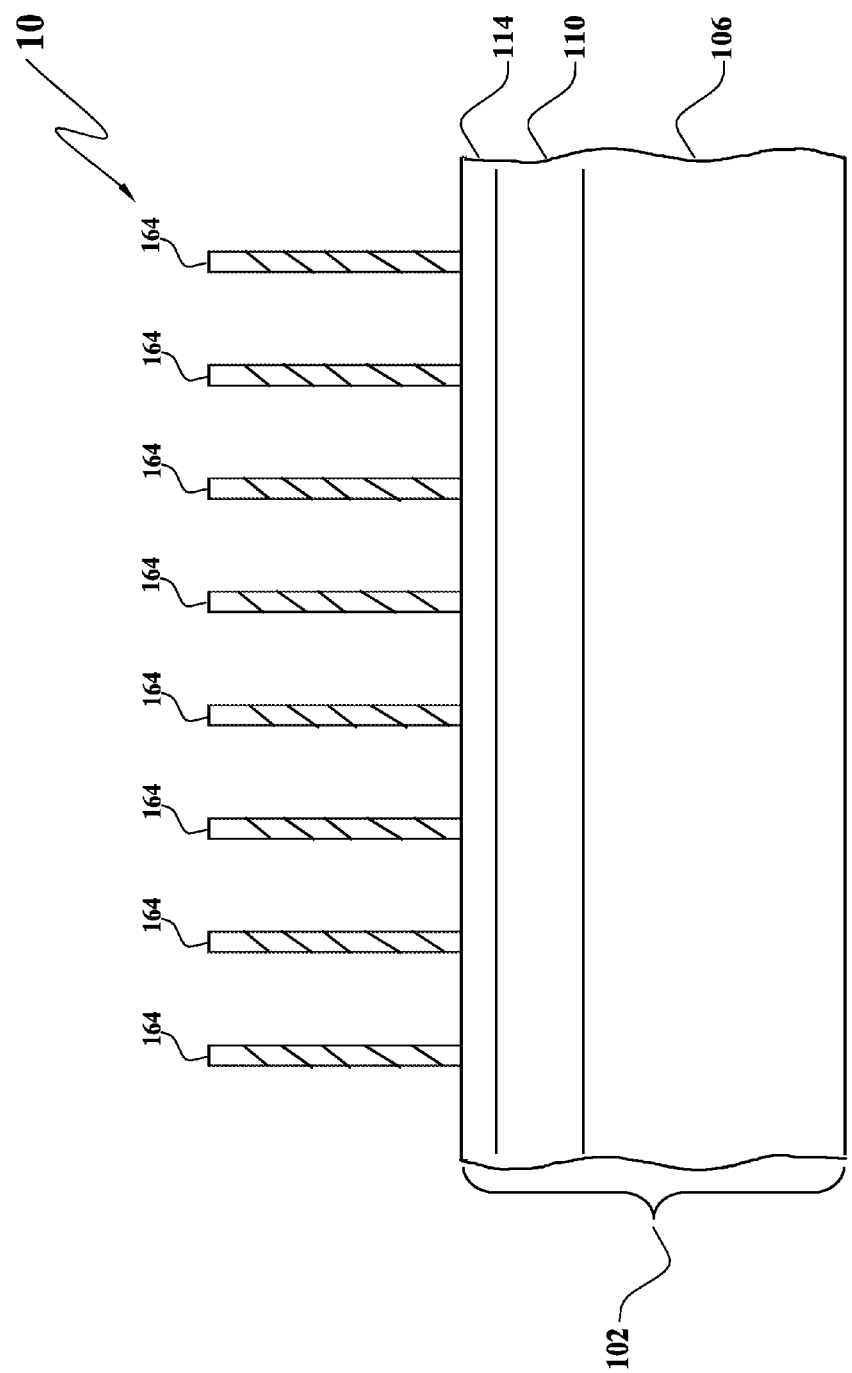
FIG. 15 illustrates a semiconductor structure in an intermediary stage fabrication.

Referring to FIG. 15, FIG. 15 illustrates the semiconductor structure 10 of FIG. 14 after removal of layer 156. Removal of layer 156 defines a FinFET structure having a fins 164 extending upwardly from layer 114 with the structure 10 being absent of material between fins 164.

Figure 16:
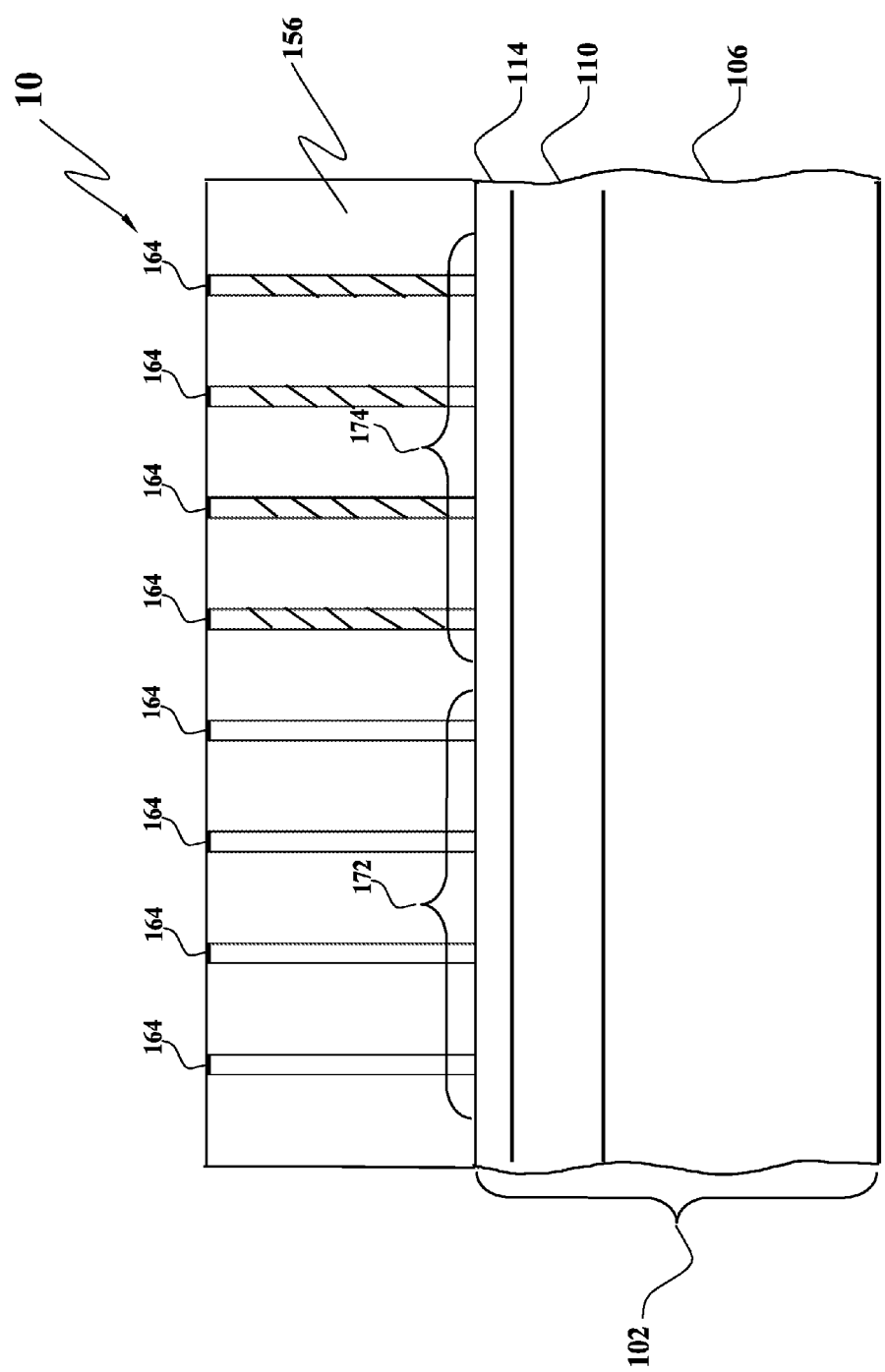
FIG. 16 illustrates a semiconductor structure in an intermediary stage fabrication.

Referring to FIG. 16, FIG. 16 illustrates the semiconductor structure 10 of FIG. 11 after formation of fins 164 within voids 160 using a process alternative to the processes as depicted in FIGS. 12 and 14. Referring to FIG. 16 fins 164 within voids 160 can be formed by subjecting a first area 172 of layer 114 to epitaxial growth to grow silicon upwardly from layer 114 and subjecting a second area 174 of layer 114 to epitaxial growth to grow a germanium based material. The germanium based material can be, e.g., SiGe or Ge. In one embodiment first area 172 having fins 164 formed of Si grown there can be an nFET area which can be doped to define n type S/D regions. In one embodiment, second area 174 having fins 164 formed of germanium based material grown, there can be a pFET area which can be doped to define p-type S/D regions.

Figure 17:
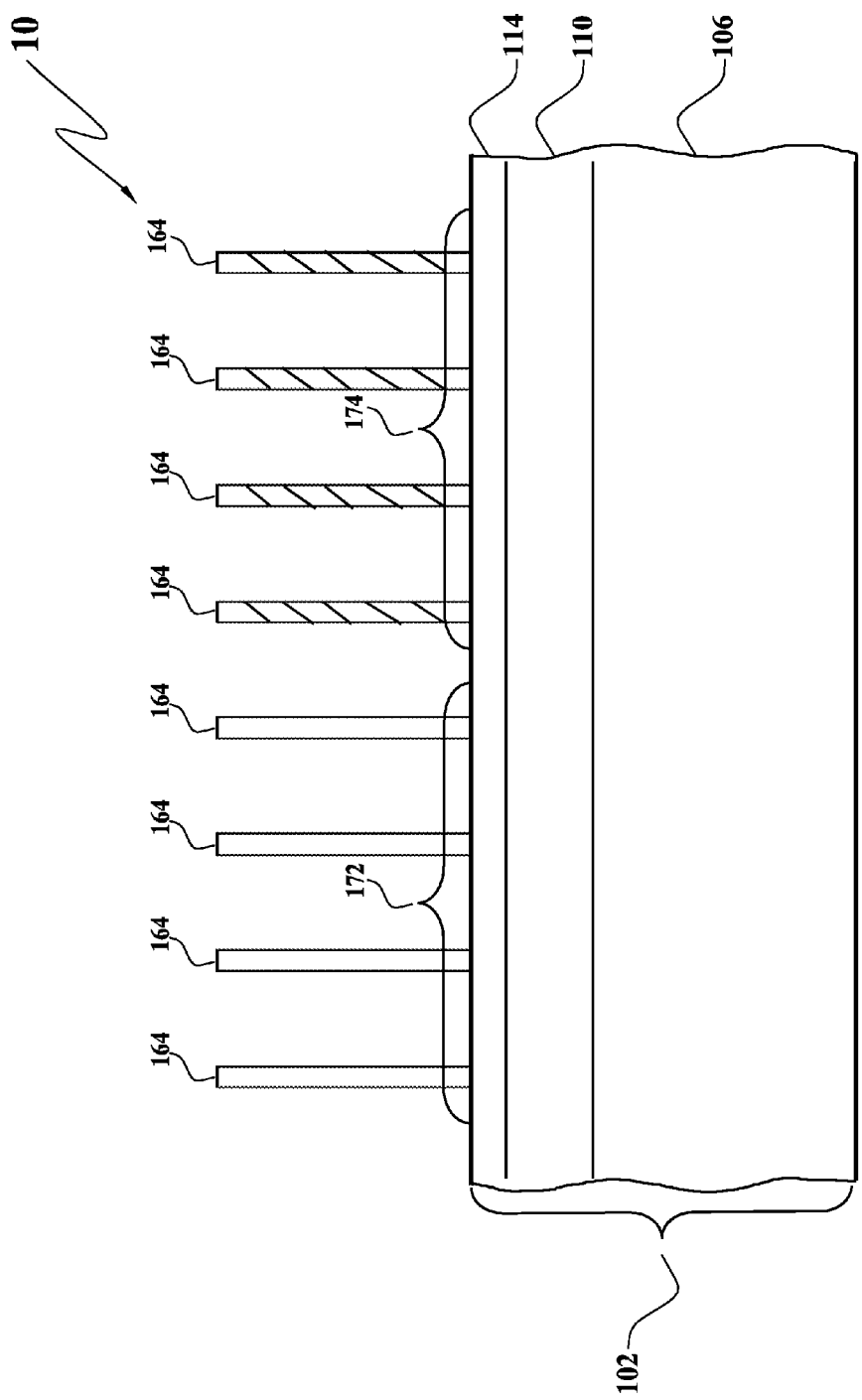
FIG. 17 illustrates a semiconductor structure in an intermediary stage fabrication.

Referring to FIG. 17, FIG. 17 illustrates the semiconductor structure 10 of FIG. 16 after removal of layer 156. Removal of layer 156 defines a FinFET structure having a fins 164 extending upwardly from layer 114 with the semiconductor structure 10 being absent of material between fins 164.

Each of the deposited layers as set forth herein, e.g., layer 106, layer 110, layer 114, layer 132, layer 136, layer 140, layer 148, and layer 156 can be deposited using any of a variety of deposition processes, including, for example, physical vapor deposition (PVD), atomic layer deposition (ALD), chemical vapor deposition (CVD), sputtering, or other known processes depending on the material composition of the layer.

In one example, protective mask layers as set forth herein, e.g., a mask layers for patterning layer 140 as set forth herein may include a material such as, for example, silicon nitride, silicon oxide, or silicon oxynitride and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 140, layer 136, layer 132, layer 148, or layer 156 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method for fabricating a semiconductor structure, the method comprising:
   disposing a multilayer structure on a wafer characterized by a thin body top layer;
   using the multilayer structure to pattern voids extending upward from the thin body top layer;
   forming within the voids fins extending upwards from the thin body top layer; and
   the voids include first voids extending upward from first area of the thin body, and second voids extending upward from a second area of the thin body, wherein the method includes epitaxial growing a first material upward from the first area of the thin body top layer and epitaxial growing a second material, different from said first material, upward from the second area of the thin body top layer.

2. The method of claim 1, wherein the thin body top layer includes silicon.

3. The method of claim 1, wherein the thin body top layer includes germanium based material.

4. The method of claim 1, wherein the wafer is a prefabricated wafer.

5. The method of claim 1, wherein the disposing includes depositing a layer of amorphous silicon followed by a layer of SiN followed by a layer of amorphous silicon.

6. The method of claim 1, wherein the disposing includes depositing a layer of polysilicon followed by a layer of SiN followed by a layer of polysilicon.

7. The method of claim 1, wherein the disposing includes depositing a first layer followed by a second layer etch stop layer followed a third layer.

8. The method of claim 1, wherein the method includes defining holes in the multilayer structure and filling the holes with certain material, wherein the voids are defined within the certain material.

9. The method of claim 1, wherein the method includes defining holes in the multilayer structure and filling the holes with an oxide material, wherein the voids are defined with the oxide.

10. The method of claim 1, wherein the forming includes epitaxial growing germanium based material upward from the thin body top layer.

11. The method of claim 1, wherein the method includes epitaxial growing Si upward from the first area of the thin body top layer and epitaxial growing germanium based material upward from the second area of the thin body top layer.

12. The semiconductor structure of claim 1, wherein the thin body top layer includes silicon.

13. The semiconductor structure of claim 1, wherein the thin body top layer includes germanium based material.

14. A semiconductor structure comprising:
    an ultrathin body layer; and
    a plurality of fins extending upward from the ultrathin body layer, wherein fins of the plurality of fins include fins formed of a material selected from the group consisting of silicon and germanium based material; and
    the ultrathin body layer includes a first area and a second area, wherein the fins of the plurality of fins include silicon based fins extending upward from the first area and germanium based fins extending upwardly from the second area.

15. The semiconductor structure of claim 14, wherein the first area is an nFET area, wherein the second area is a pFET area.

16. The semiconductor structure of claim 15, wherein the germanium based fins include fins formed of Ge.

17. The semiconductor structure of claim 15, wherein the germanium based fins include fins formed of SiGe.

18. The semiconductor structure of claim 15, wherein the fins of the plurality of fins include fins formed of silicon.

19. The semiconductor structure of claim 15, wherein the fins of the plurality of fins include fins formed of germanium based material.

20. A semiconductor structure comprising:
an ultrathin body layer;
a plurality of fins extending upwards from said thin body layer; and
the ultrathin body layer comprises a first area and a second area, wherein a portion of said plurality of fins include fins formed of a first material extending upward from said first area and a second portion of said plurality of fins includes fins formed of a second material, different from said first material, extending upward from said second area.

* * * * *